(12) United States Patent
Sarver et al.

(10) Patent No.: US 7,933,685 B1
(45) Date of Patent: Apr. 26, 2011

(54) SYSTEM AND METHOD FOR CALIBRATING A WAFER HANDLING ROBOT AND A WAFER CASSETTE

(75) Inventors: Roger Sarver, Gorham, ME (US); Christopher Qualey, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1042 days.

(21) Appl. No.: 11/328,577

(22) Filed: Jan. 10, 2006

(51) Int. Cl.
*G06F 19/00* (2006.01)
*G06F 7/00* (2006.01)
*E04H 6/00* (2006.01)
*B65G 25/00* (2006.01)

(52) U.S. Cl. ........ 700/245; 700/213; 700/229; 700/250; 414/229; 414/160; 414/416.01; 324/765

(58) Field of Classification Search .............. 700/213, 700/229, 245, 250; 414/229, 160, 416.01; 324/765; 294/160, 87.1
See application file for complete search history.

(56) References Cited

U.S. PATENT DOCUMENTS

| | | | |
|---|---|---|---|
| 4,819,167 A | 4/1989 | Cheng et al. | |
| 5,563,798 A | 10/1996 | Berken et al. | |
| 5,647,626 A * | 7/1997 | Chen et al. | 294/87.1 |
| 5,980,194 A | 11/1999 | Freerks et al. | |
| 6,075,334 A * | 6/2000 | Sagues et al. | 318/568.11 |
| 6,242,879 B1 | 6/2001 | Sagues et al. | |
| 6,360,144 B1 * | 3/2002 | Bacchi et al. | 700/250 |
| 6,409,453 B1 * | 6/2002 | Brodine et al. | 414/416.01 |
| 6,438,458 B2 * | 8/2002 | Shimoike et al. | 700/250 |
| 6,542,839 B1 * | 4/2003 | Lu et al. | 702/94 |
| 6,543,980 B2 * | 4/2003 | Lin et al. | 414/160 |
| 6,543,982 B1 * | 4/2003 | Nichols et al. | 414/331.16 |
| 6,925,356 B2 * | 8/2005 | Schauer et al. | 700/213 |
| 7,033,168 B1 * | 4/2006 | Gupta et al. | 432/253 |
| 7,054,713 B2 * | 5/2006 | Teng et al. | 700/218 |
| 7,158,857 B2 * | 1/2007 | Schauer et al. | 700/218 |
| 7,283,255 B2 * | 10/2007 | Ramsey et al. | 356/620 |
| 7,289,230 B2 * | 10/2007 | Ramsey et al. | 356/622 |
| 7,290,813 B2 * | 11/2007 | Bonora et al. | 294/1.1 |
| 7,300,082 B2 * | 11/2007 | Rogers et al. | 294/104 |
| 7,334,826 B2 * | 2/2008 | Woodruff et al. | 294/103.1 |
| 2001/0020199 A1 * | 9/2001 | Bacchi et al. | 700/245 |
| 2002/0068992 A1 * | 6/2002 | Hine et al. | 700/229 |
| 2002/0076305 A1 * | 6/2002 | Lin et al. | 414/160 |
| 2003/0006213 A1 * | 1/2003 | Biskeborn | 216/22 |
| 2003/0014155 A1 * | 1/2003 | Pencis et al. | 700/213 |
| 2003/0135302 A1 * | 7/2003 | Hung et al. | 700/245 |
| 2003/0209050 A1 * | 11/2003 | Chen et al. | 73/1.01 |

(Continued)

OTHER PUBLICATIONS

Dave Fusaro, "Teach Your Robots Well", Control Design Magazine, May 2003, 3 pages.

(Continued)

*Primary Examiner* — Khoi Tran
*Assistant Examiner* — Ian Jen

(57) ABSTRACT

A system and method is disclosed for calibrating a semiconductor wafer handling robot and a semiconductor wafer cassette. A robot blade boot is attached to a robot blade of the semiconductor handling robot. The robot blade boot decreases a value of tolerance for the robot blade to move between two semiconductor wafers in the semiconductor wafer cassette. In one embodiment the vertical tolerance is decreased to approximately twenty thousandths of an inch (0.020") on a top and a bottom of the robot blade boot. The use of the robot blade boot makes the calibration steps more critical and precise. The robot blade boot is removed from the robot blade after the calibration process has been completed.

20 Claims, 6 Drawing Sheets

U.S. PATENT DOCUMENTS

| | | | |
|---|---|---|---|
| 2004/0043514 A1* | 3/2004 | Mayo | 438/1 |
| 2004/0182824 A1* | 9/2004 | Barnes et al. | 216/83 |
| 2004/0204726 A1* | 10/2004 | Miller et al. | 606/165 |
| 2005/0017529 A1* | 1/2005 | Rogers et al. | 294/103.1 |
| 2005/0046437 A1* | 3/2005 | Kim | 324/765 |
| 2005/0110974 A1* | 5/2005 | Hashimoto et al. | 355/72 |
| 2005/0203664 A1* | 9/2005 | Schauer et al. | 700/213 |
| 2005/0210669 A1* | 9/2005 | Yoshida et al. | 29/750 |
| 2008/0251473 A1* | 10/2008 | Rebstock et al. | 211/41.18 |

OTHER PUBLICATIONS

Mike Tao Zhang et al., "Fixture-Based Industrial Robot Calibration for Silicon Wafer Handling", pp. 1-8.

Peter M. Zakit, "Robots That Teach Themselves", Machine Design, Dec. 12, 2002, 5 pages.

* cited by examiner

SYSTEM AND METHOD FOR CALIBRATING A WAFER HANDLING ROBOT AND A WAFER CASSETTE

TECHNICAL FIELD OF THE INVENTION

The present invention is generally directed to manufacturing technology for semiconductor devices and, in particular, to a system and method for calibrating a wafer handling robot and a wafer cassette.

BACKGROUND OF THE INVENTION

In the manufacture of semiconductor wafers it is common to utilize machines to handle the semiconductor wafers. Semiconductor wafers are quite valuable. Each semiconductor wafer may represent as much as eighty thousand dollars worth of product. Because the semiconductor wafers are fragile they must be handled with care so that they are not damaged during the manufacturing process. For this reason wafer handling robots are commonly used to move semiconductor wafers inside manufacturing equipment.

Wafer handling robots must be calibrated so that they are capable of moving a semiconductor wafer between a precisely located pick up point and a precisely located delivery point. The process of calibrating the operation of a wafer handling robot is referred to as "teaching" the robot. After a wafer handling robot has been calibrated or "taught" it may function properly for a period of time and then need to be recalibrated. It may be necessary to perform the teaching process several times a year for each robot. It is well known that a manually performed teaching process is time consuming and subjective when done without calibration tools. It may take an expert equipment technician several hours to successfully teach a typical wafer handling robot.

The process of calibrating a wafer handling robot and a wafer cassette may comprise (1) a process of calibrating the wafer handling robot to the wafer cassette, and (2) a process of calibrating the wafer cassette to the wafer handling robot.

For purposes of illustration, consider a portion of an exemplary prior art robot arm 100 shown in FIG. 1. Robot arm 100 comprises a base 110, a pivotally mounted first robot arm section 120, a pivotally mounted second robot arm section 130, and a pivotally mounted third robot arm section 140. The first robot arm section 120 pivots with respect to base 110. The second robot arm section pivots with respect to the first robot arm section 120. The third robot arm section 140 pivots with respect to the second robot arm section 130. The free end of the third robot arm section 140 comprises two spaced apart extensions 150 for gripping and holding a semiconductor wafer (not shown in FIG. 1).

During the semiconductor manufacturing process it is common to store the semiconductor wafers in a wafer cassette. A wafer cassette comprises a housing for holding a plurality of semiconductor wafers. An exemplary prior art wafer cassette 210 and exemplary prior art robot arm 100 are illustrated in FIG. 2.

The interior walls of wafer cassette 210 are constructed so that they form a plurality of wafer slots 220. Each wafer slot 220 is adapted to receive and hold a semiconductor wafer 230. The robot arm 100 is operated to precisely place a semiconductor wafer 230 in an empty wafer slot 220. Upon receiving an appropriate command, the robot arm 100 is capable of retrieving a designated semiconductor wafer 230 from its respective wafer slot 220.

The process of calibrating the alignment of the robot arm 100 to the wafer cassette 210 is referred to as "robot to cassette calibration" or simply "cassette calibration." During the cassette calibration process a robot blade that is mounted on the end of robot arm 100 is employed. The robot blade is inserted between two successive semiconductor wafers 230 that are located within wafer slots 220 of the wafer cassette 210.

The technician who is performing the calibration procedure makes adjustments to the calibration of the robot arm 100 by centering the robot blade between the two semiconductor wafers 230. This requires the technician to observe the position of the robot blade when it is located between the two semiconductor wafers 230. Because the centering process is manually performed by the technician using his subjective observation, there may be "human error" inadvertently introduced during the centering process. It is very difficult for the technician to accurately determine exactly where the end of the robot blade is properly centered.

For example, consider the prior art robot blade 300 shown in FIG. 3. FIG. 3 illustrates a side view of prior art robot blade 300 of robot arm 100 while robot blade 300 is inserted between two semiconductor wafers, 230a and 230b. For purposes of clarity, the walls of the wafer cassette 210 and the wafer cassette slots 220 are not shown in FIG. 3. As may be seen in FIG. 3, the end of robot blade 300 is closer to the top surface of lower wafer 230b than to the bottom surface of upper wafer 230a. That is, the end of robot blade 300 is not centered halfway between the two semiconductor wafers, 230a and 230b. The fact that the end of robot blade 300 is not properly centered may also be seen in the end view of robot blade 300 (and semiconductor wafers, 230a and 230b) shown in FIG. 4.

The end of the robot blade 300 does not touch either the top of lower semiconductor wafer 230b or the bottom of upper semiconductor wafer 230a. For this reason, the technician may erroneously assume that the end of the robot blade 300 is properly centered when it is not, in fact, properly centered.

There is also another source of observation error. The process of viewing the location of the robot blade 300 between the two semiconductor wafers 230a and 230b can be distorted by a parallax effect caused by the reflection of an image of the robot blade 300 in the mirror surface of one of the semiconductor wafers.

FIG. 5 illustrates this problem. FIG. 5 illustrates a top perspective view of robot blade 300 located between the upper semiconductor wafer 230a and the lower semiconductor wafer 230b. The reflected image 410 of the robot blade 300 appears as a reflection in the upper surface of the lower semiconductor wafer 230b. The presence of the reflected image 410 may cause the observational judgment of the technician to be in error.

In view of the deficiencies of the prior art method, there is a need for a system and method that is capable of accurately aligning a semiconductor wafer handling robot with respect to a semiconductor wafer cassette. There is also a need in the art for a system and method that is capable of minimizing the human error involved during an alignment of a semiconductor wafer handling robot with respect to a semiconductor wafer cassette.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 6 through 13, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor wafer handling robot.

The present invention uses a device that is detachably affixed to the end of a robot blade to create a closer tolerance (i.e., a smaller value of tolerance) for the placement of the robot blade between the semiconductor wafers. Because the device may be attached to and detached from the end of a robot blade, the device is referred to as a "robot blade boot." The robot blade boot is used only during the calibration process. That is, the technician places the robot blade boot on the robot blade only to perform the calibration process. The technician removes the robot blade boot from the robot blade during the production process. The use of the robot blade boot makes the calibration steps more critical and requires a closer tolerance for the robot blade to move between the semiconductor wafers.

Figure 1:
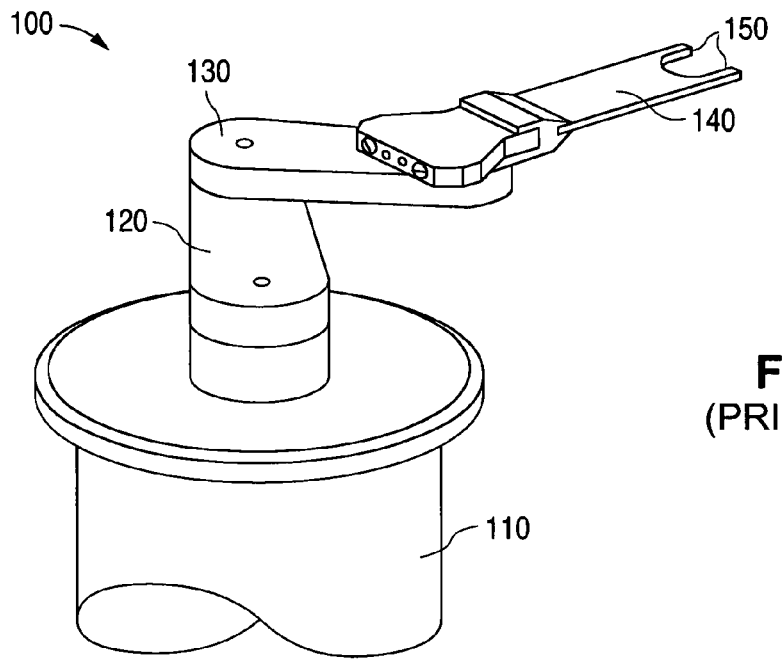
FIG. 1 illustrates a robot arm of a prior art wafer handler robot for transporting a semiconductor wafer.
Figure 2:
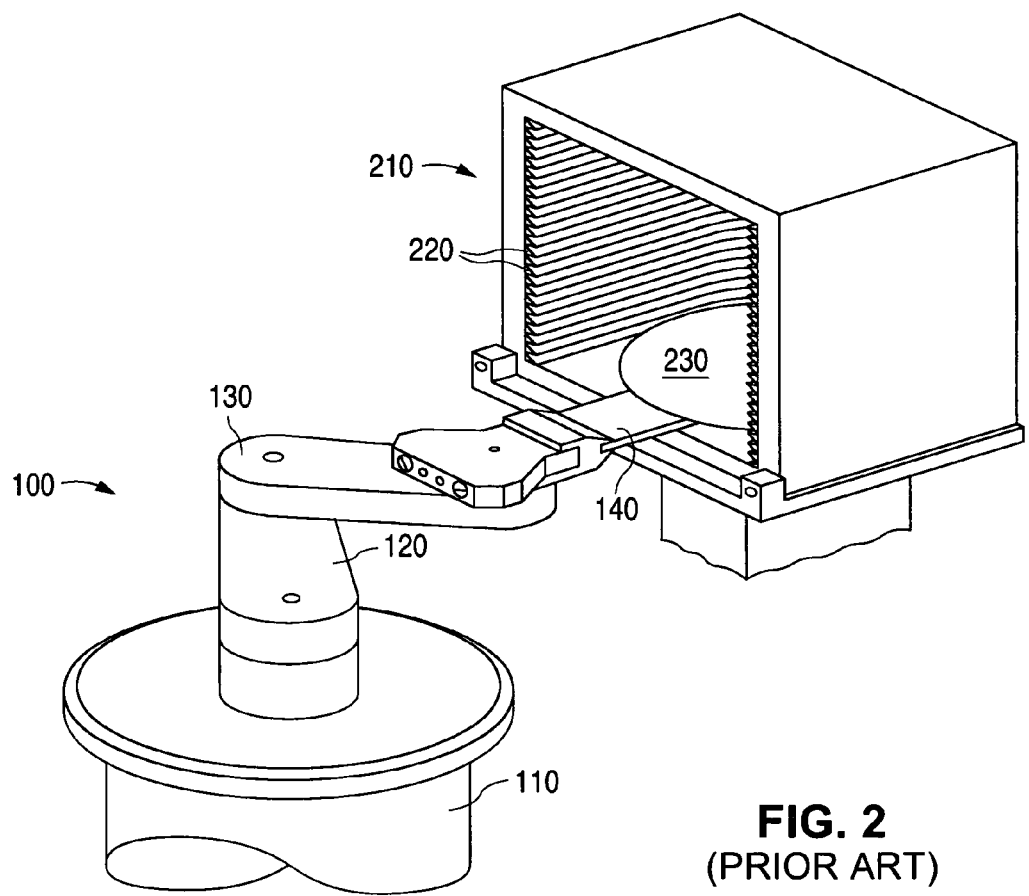
FIG. 2 illustrates a robot arm of a prior art wafer handler robot that is placing a semiconductor wafer within a prior art wafer cassette.
Figure 3:
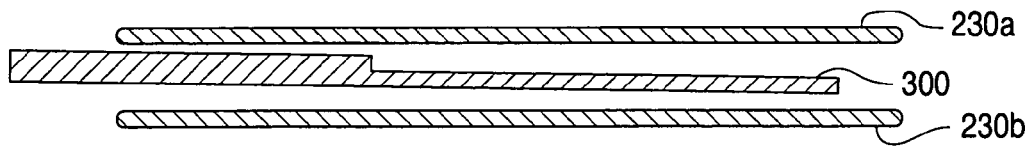
FIG. 3 illustrates a side view of a prior art robot blade of a prior art robot arm inserted between two semiconductor wafers.
Figure 4:
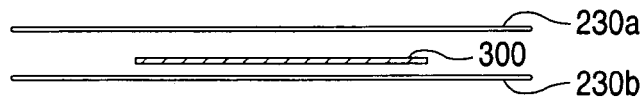
FIG. 4 illustrates an end view of the prior art robot blade shown in FIG. 3 inserted between two semiconductor wafers.
Figure 5:
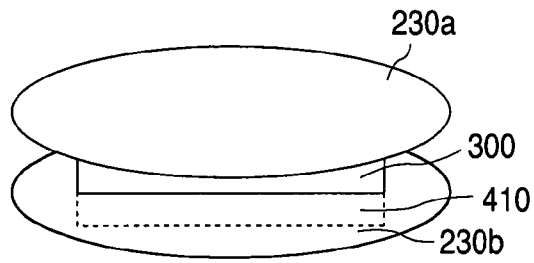
FIG. 5 illustrates a top perspective view of a prior art robot blade located between two semiconductor wafers showing a reflected image of the robot blade in the lower semiconductor wafer.
Figure 6:
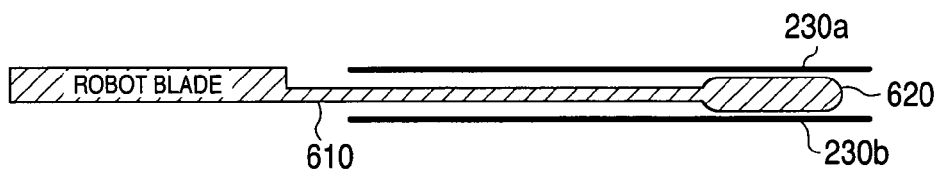
FIG. 6 illustrates a side view of a robot blade of the present invention inserted between two semiconductor wafers.

FIG. 6 illustrates a side view of a robot blade 610 of the present invention while robot blade 610 is inserted between two semiconductor wafers, 230a and 230b. For purposes of clarity, the walls of the wafer cassette 210 and the wafer cassette slots 220 are not shown in FIG. 6. As may be seen with reference to FIG. 6, a robot blade boot 620 of the present invention is affixed to the end of the robot blade 610. The robot blade boot 620 is thicker than the thickness of the robot blade 610. The dimensions and the tolerances of the robot blade boot 620 will be discussed more fully below.

Figure 7:
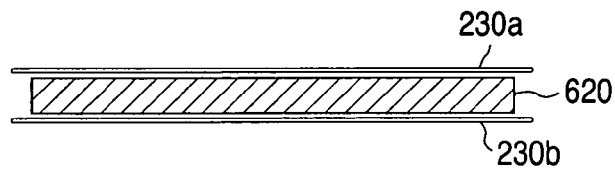
FIG. 7 illustrates an end view of the robot blade of the present invention shown in FIG. 6 inserted between two semiconductor wafers.

FIG. 7 illustrates an end view of the robot blade boot 620 of the present invention shown in FIG. 6 inserted between the two semiconductor wafers, 230a and 230b. As shown in FIG. 7, the thickness of the robot blade boot 620 occupies most of the space between the two semiconductor wafers, 230a and 230b.

Although the robot blade boot 620 is shown in a dark color in FIG. 6 and in FIG. 7, in practice it is preferable for the robot blade boot 620 to be painted a light color. A light color (e.g., white) increases the visibility and visual contrast of the edges of the robot blade boot 620 when the robot blade boot 620 is positioned between two semiconductor wafers, 230a and 230b.

The distance between the two semiconductor wafers, 230a and 230b, is approximately two hundred twenty thousandths of an inch (0.220"). The thickness of an end of a typical prior art robot blade 300 is approximately ninety thousands of an inch (0.090"). This means that the prior art robot blade 300 has a clearance of approximately sixty five thousandths of an inch (0.065") on top and bottom when the robot blade 300 is centered between the two semiconductor wafers, 230a and 230b.

The thickness of the robot blade boot 620 of the present invention is approximately one hundred eighty thousandths of an inch (0.180"). This is approximately twice the thickness of the prior art robot blade 300. This means that the robot blade boot 620 has a clearance of approximately twenty thousandths of an inch (0.020") on top and bottom when the robot blade boot 620 is centered between the two semiconductor wafers, 230a and 230b. This value of tolerance represents a significantly reduced tolerance for passing the robot blade boot 620 between the two semiconductor wafers, 230a and 230b.

A thickness of the robot blade boot 620 of approximately one hundred eighty thousandths of an inch (0.180") ensures that the calibration is not set too low. If the calibration is set too low (using the prior art method), then the robot blade 300 will scratch many of the semiconductor wafers. The present invention prevents such scratching (and destruction) of semiconductor wafers.

The robot blade boot 620 of the present invention also solves another problem encountered in the prior art. In cases where there are twenty five (25) wafer slots in a cassette wafer, it is common practice to first calibrate slot one (1) and slot two (2) and then calibrate slot twenty four (24) and slot twenty five (25). These calibrations usually are satisfactory.

The problem comes when the middle slots, such as slot thirteen (13) and slot fourteen (14), are subsequently calibrated. In one particular vendor's cassette design it is often the case that the calibration for the middle slots is too low.

Because the calibrations cannot be separated for each slot, the technician will have to adjust (or "fudge") the calibration of the top slots (slot 1 and slot 2) and the calibration of the bottom slots (slot 24 and slot 25) in order to get the middle slots (slot 13 and slot 14) to calibrate.

This adjustment process is very subjective and allows for the entry of human error in the calibration process. The use of the robot blade boot 620 of the present invention reduces the subjectivity that is inherent in the process of calibrating twenty five (25) slots in a wafer cassette.

Figure 8:
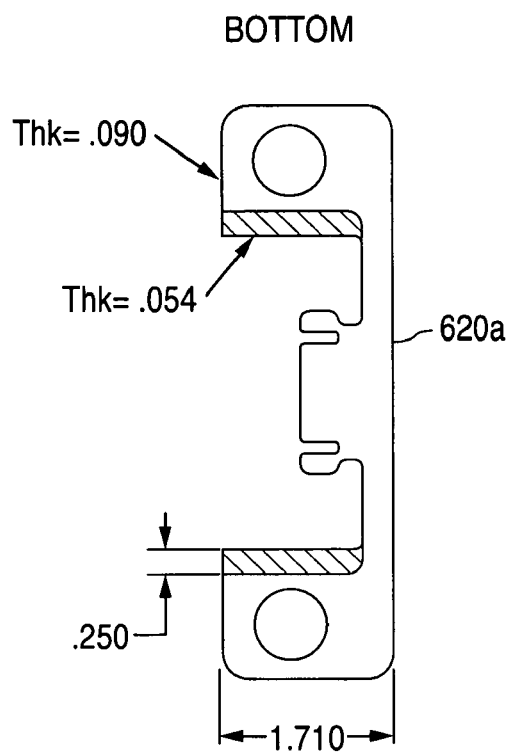
FIG. 8 illustrates a view of a bottom half of a robot blade boot of the present invention.
Figure 9:
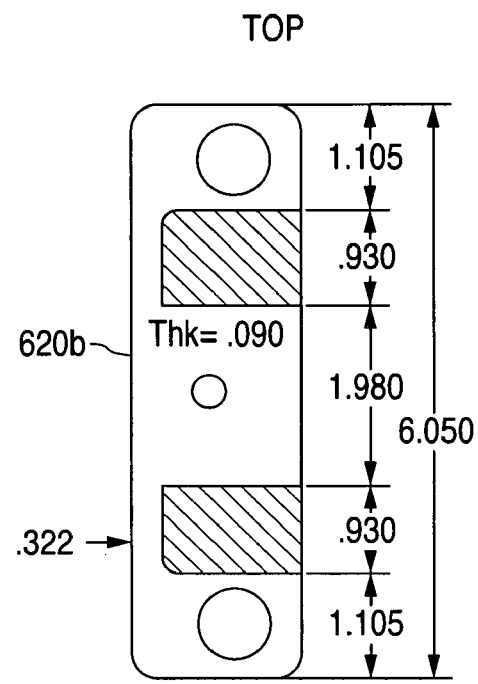
FIG. 9 illustrates a view of a top half of a robot blade boot of the present invention.

In one advantageous embodiment of the invention, the robot blade boot 620 comprises two portions. As shown in FIG. 8, the first portion 620a is a bottom half of robot blade boot 620. As shown in FIG. 9, the second portion 620b is a top half of robot blade boot 620. The thickness of the first portion 620a is ninety thousandths of an inch (0.090") and the thickness of the second portion 620b is also ninety thousandths of an inch (0.090"). When the two halves are placed together their combined thickness is one hundred eighty thousandths of an inch (0.180").

As also shown in FIG. 8, in one advantageous embodiment the length of the robot blade boot 620 is approximately one and seven tenths of an inch (1.7"). As also shown in FIG. 9, in one advantageous embodiment the width of the robot blade boot 620 is approximately six inches (6.0"). Dimensions of other portions of the robot blade boot are shown in FIG. 8 and in FIG. 9. Robot blade boot 620 is formed by attaching the first portion 620a (bottom half) to the second portion 620b (top half). The two portions of robot blade boot 620 may be attached together by conventional means.

Figure 10:
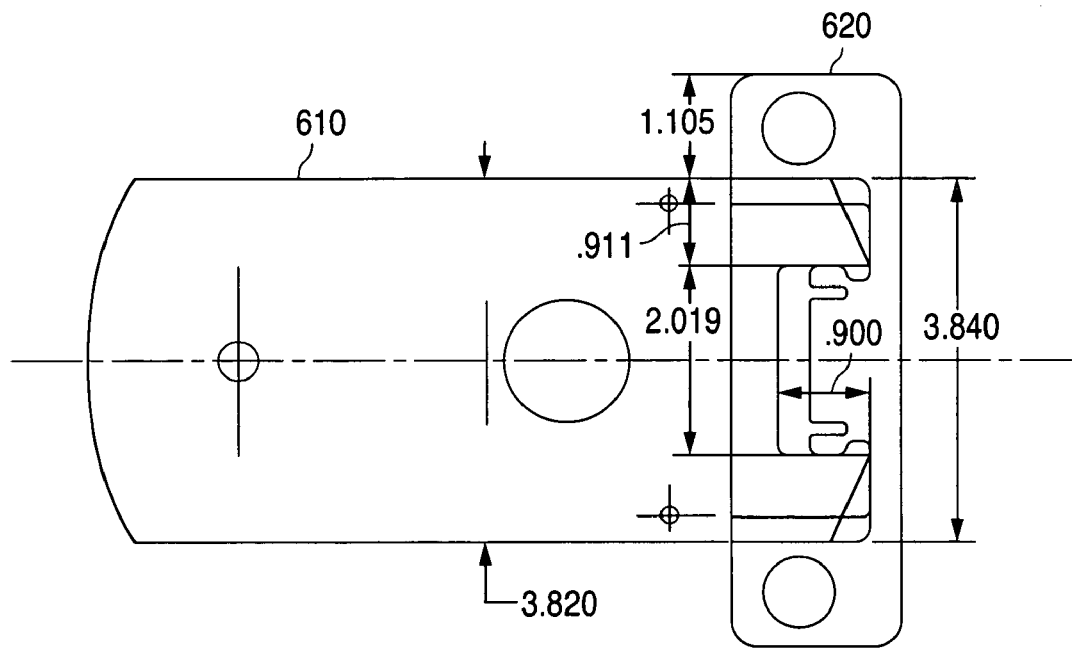
FIG. 10 illustrates an attachment of a robot blade boot of the present invention to an end of a robot blade.

FIG. 10 illustrates an attachment of a robot blade boot 620 of the present invention to an end of a robot blade 610. As shown in FIG. 10, in one advantageous embodiment the width of the robot blade 610 is approximately three and eight tenths inches (3.8"). The robot blade boot 620 fits over the end of the robot blade 610.

When the robot blade boot 620 is slipped over the end of the robot blade 610, the robot blade boot 620 clamps on to the end of the robot blade 610. The robot blade boot 620 remains affixed to the robot blade 610 by frictional forces. The frictional forces retain the robot blade boot 620 on the robot blade 610 during the calibration process. After the calibration process has been completed the robot blade boot 620 is removed from the end of the robot blade 610 by pulling on the robot blade boot 620 with enough force to overcome the frictional forces.

The robot blade boot 620 described above is capable of enabling the calibration process to be carried out with an increased level of precision in the vertical direction. That is, as previously described, the value of tolerance for the robot blade 610 to move between two adjacent semiconductor wafers in the semiconductor wafer cassette is decreased both above and below the robot blade 610.

In alternate advantageous embodiment of the invention the robot blade boot 620 is capable of enabling the calibration process to be carried out with an increased level of precision in the horizontal direction. In this alternate embodiment of the invention the horizontal dimensions (i.e., the lateral dimensions) of the robot blade boot 620 are selected to decrease a value of tolerance for the robot blade 610 to move laterally between the two adjacent semiconductor wafers.

As the robot blade 610 (with robot blade boot 620) is extended into the space between the two adjacent semiconductor wafers toward the back of the wafer cassette, the available horizontal space decreases. The use of the robot blade boot 620 of the present invention reduces the subjectivity that is inherent in the process of calibrating the horizontal position of the robot blade 610 within the wafer cassette. The lateral dimensions of the robot blade boot 620 are selected so that the robot blade 610 is capable of moving all the way through the space between the two semiconductor wafers to the back of the wafer cassette.

Figure 11:
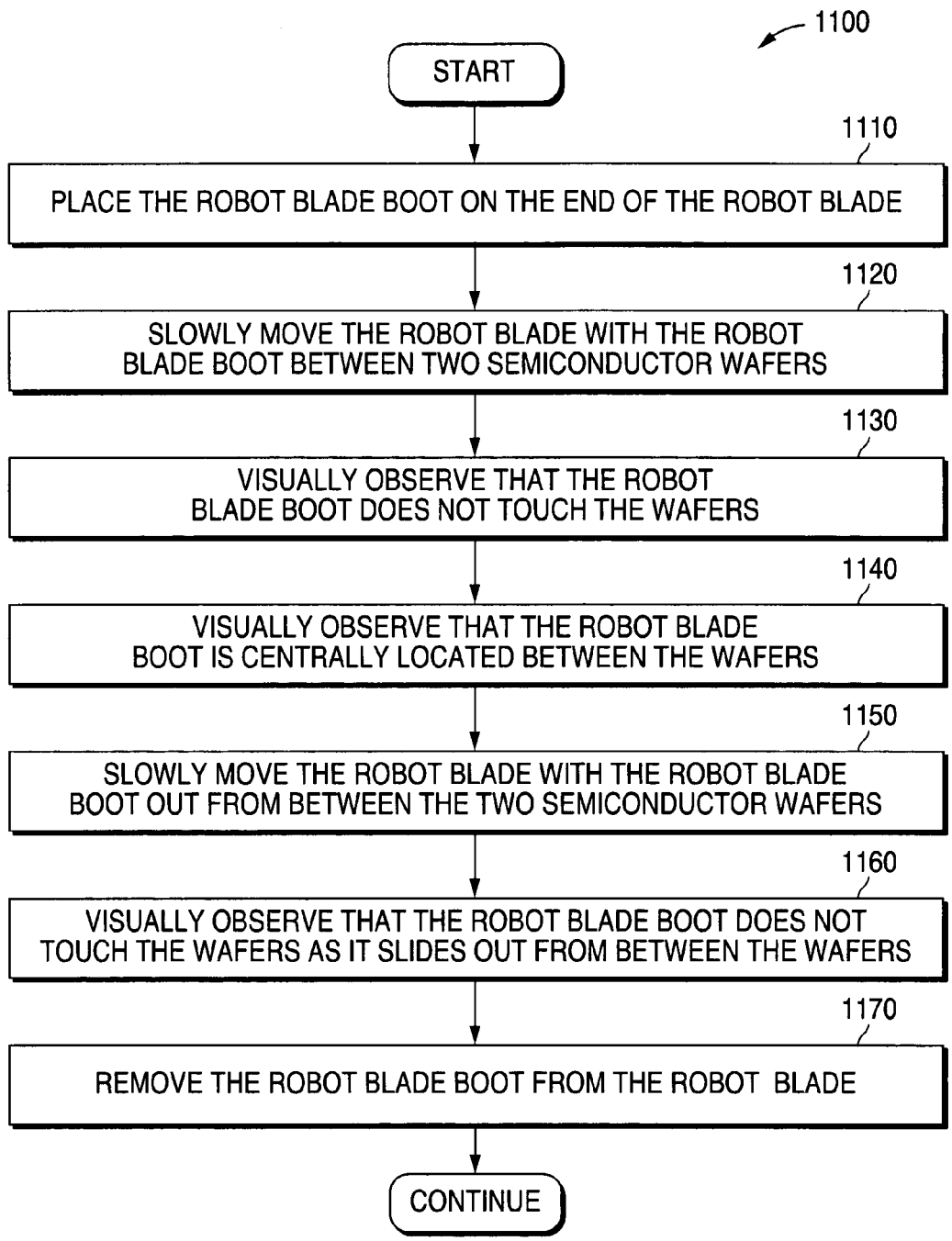
FIG. 11 illustrates a flow chart showing a first advantageous embodiment of a method of the present invention.

FIG. 11 illustrates a flow chart 1100 showing a first advantageous embodiment of a method of the present invention. To perform the calibration process the technician places the robot blade boot 620 of the present invention on the end of the robot blade 610 (step 1110). The technician then causes the robot blade 610 to slowly move into position between two semiconductor wafers 230a and 230b (step 1120). The technician visually observes that the robot blade boot 620 does not touch the upper semiconductor wafer 230a or the lower semiconductor wafer 230b during the movement (step 1130). The technician also visually observes that the robot blade boot 620 is centrally located between the two semiconductor wafers 230a and 230b (step 1140).

The technician then slowly removes the robot blade from between the two semiconductor wafers 230a and 230b (step 1150). The technician visually observes that the robot blade boot 620 does not touch the semiconductor wafers 230a and 230b as the robot blade boot 620 slides out from between the two semiconductor wafers 230a and 230b (step 1160). After the calibration process is complete, the technician removes the robot blade boot 620 from the robot blade 610 (step 1170).

The calibration method of the present invention comprises both the calibration of a robot arm to a wafer cassette and the calibration of a wafer cassette to a robot arm.

Figure 12:
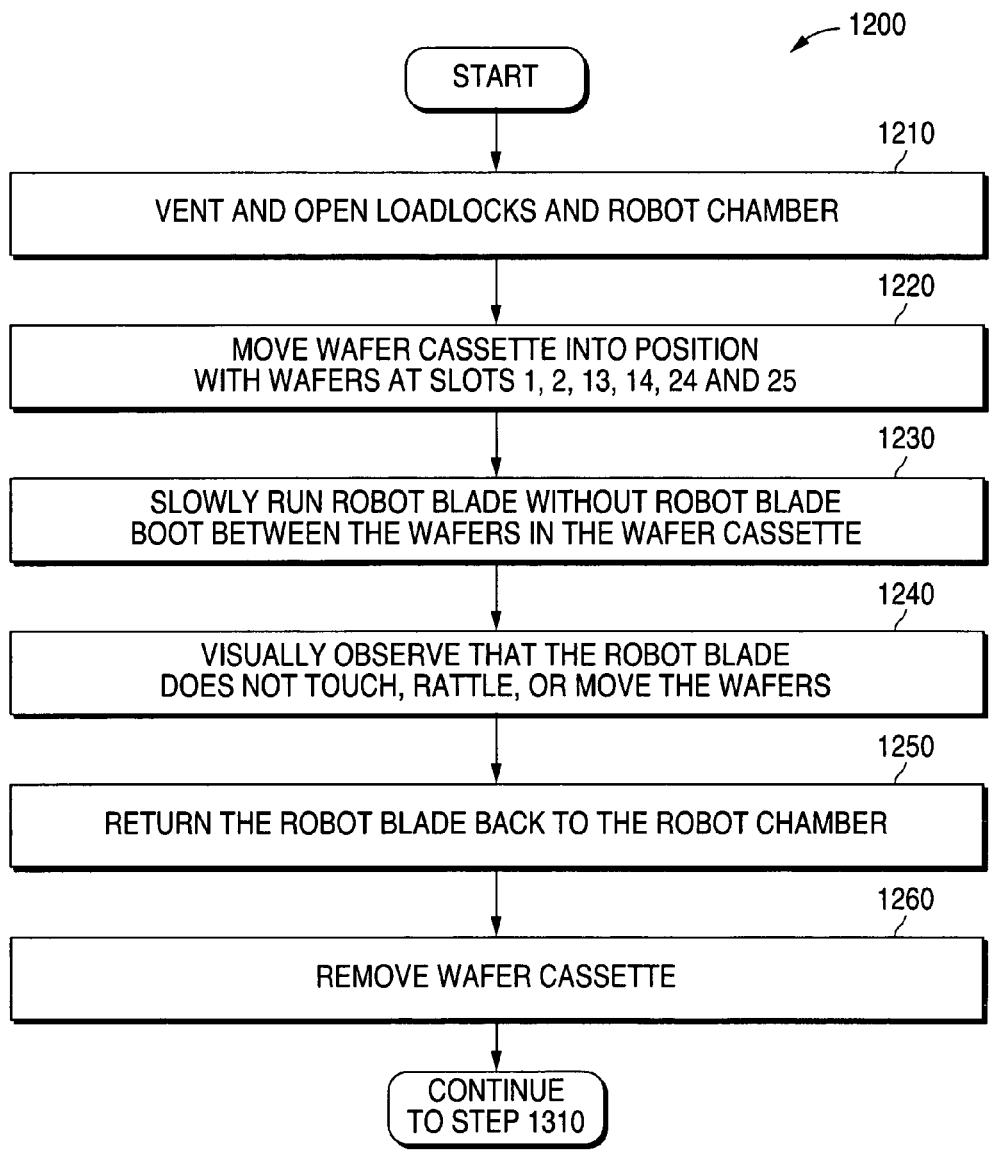
FIG. 12 illustrates a flow chart showing a first portion of a second advantageous embodiment of a method of the present invention.

FIG. 12 illustrates a flow chart 1200 showing a first portion of a second advantageous embodiment of a method of the present invention. This second advantageous embodiment of the method refers to loadlocks and a robot chamber of a prior art wafer handling robot arrangement. The loadlocks and robot chamber are structures that are well known in the art. First both the loadlocks and the robot chamber of the wafer handing robot are vented and opened (step 1210). Then a wafer cassette having wafers at slots 1, 2, 13, 14, 24 and 25 is moved into position (step 1220). Then the robot blade (without a robot blade boot) is slowly run between the wafers in the wafer cassette (step 1230).

Visual observation is then made that the robot blade does not touch, rattle or move the wafers (step 1240). Then the robot blade is returned back to the robot chamber (step 1250). Then the wafer cassette is removed (step 1260). Then the control of the process passes to step 1310 of the method shown in FIG. 13.

Figure 13:
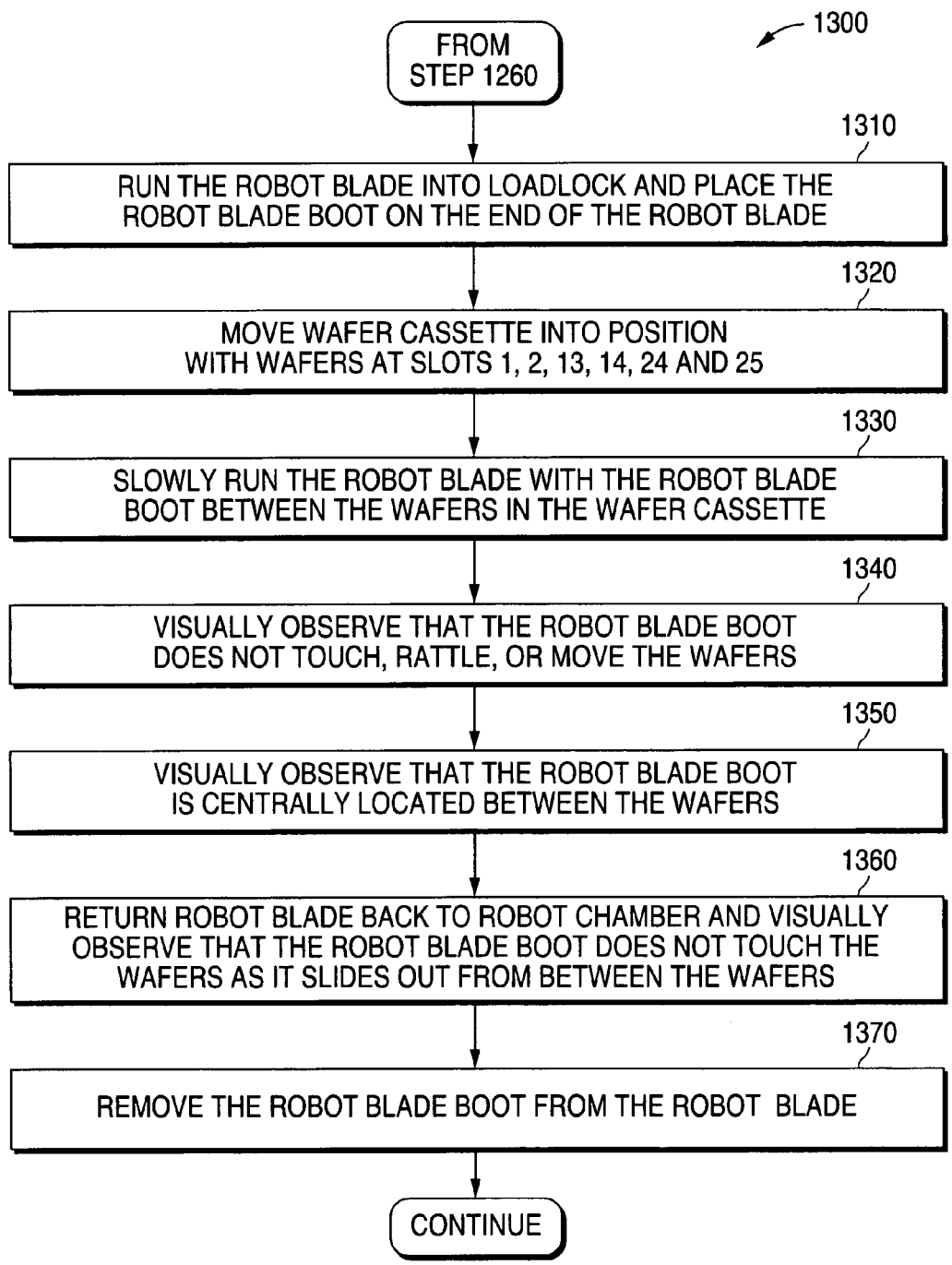
FIG. 13 illustrates a flow chart showing a second portion of a second advantageous embodiment of a method of the present invention.

FIG. 13 illustrates a flow chart 1300 showing a second portion of a second advantageous embodiment of a method of the present invention. Control passes to step 1310 from step 1260 of the method shown in FIG. 12. The robot blade is run into loadlock and a robot blade boot of the present invention is placed on the end of the robot blade (step 1310). Then the wafer cassette having wafers at slots 1, 2, 13, 14, 24 and 25 is moved into position (step 1320). Then the robot blade with the robot blade boot of the present invention is slowly run between the wafers in the wafer cassette (step 1330).

Visual observation is then made that the robot blade boot does not touch, rattle or move the wafers (step 1340). Visual observation is then made that the robot blade boot is centrally located between the wafers (step 1350). Then the robot blade is returned back to the robot chamber and it is visually observed that the robot blade boot does not touch the wafers as it slides out from between the wafers (step 1360). Then the robot blade boot is removed from the robot blade (step 1370).

The calibration method of the present invention comprises both the calibration of a robot arm to a wafer cassette and the calibration of a wafer cassette to a robot arm.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for calibrating a semiconductor wafer handling robot and a semiconductor wafer cassette, the method comprising the steps of:
    attaching, to a free end of a robot blade of the semiconductor wafer handling robot, a robot blade boot that decreases a value of tolerance for the robot blade to move between two semiconductor wafers in the semiconductor wafer cassette;
    calibrating the wafer handling robot with the robot blade boot attached to the free end of the robot blade; and
    after the calibration, removing the robot blade boot from the free end of the robot blade.

2. The method as set forth in claim 1, wherein the step of calibrating the wafer handling robot comprises inserting the robot blade with the robot blade boot into a slot of the semiconductor wafer cassette between the two semiconductor wafers.

3. The method as set forth in claim 1, wherein attaching the robot blade boot to the free end of the robot blade decreases at least one of: a value of tolerance in a vertical direction and a value of tolerance in a horizontal direction for the robot blade to move between the two semiconductor wafers.

4. The method as set forth in claim 2, wherein attaching the robot blade boot to the free end of the robot blade comprises attaching a robot blade boot having a thickness of approximately one hundred eighty thousandths of an inch (0.180") to the free end of the robot blade.

5. The method as set forth in claim 4, wherein:
    a distance between the two semiconductor wafers in the semiconductor wafer cassette is approximately two hundred twenty thousandths of an inch (0.220"); and
    attaching the robot blade boot to the free end of the robot blade decreases the value of tolerance for the robot blade boot to move between the two semiconductor wafers in the semiconductor wafer cassette to approximately twenty thousandths of an inch (0.020") on a top and a bottom of the robot blade boot.

6. The method as set forth in claim 2, further comprising the steps of:
    coloring the robot blade boot with a light color; and
    increasing a visual contrast of the robot blade boot with respect to the two semiconductor wafers when the robot blade boot is positioned between the two semiconductor wafers.

7. The method as set forth in claim 2, wherein the step of calibrating the wafer handling robot comprises:
    moving the robot blade with the robot blade boot between the two semiconductor wafers; and
    visually observing that the robot blade boot does not touch the two semiconductor wafers when the robot blade boot is moving between the two semiconductor wafers.

8. A method for calibrating a semiconductor wafer handling robot and a semiconductor wafer cassette, the method comprising the steps of:
    attaching, to a free end of a robot blade of the semiconductor wafer handling robot, a robot blade boot that decreases a value of tolerance for the robot blade to move between two semiconductor wafers in the semiconductor wafer cassette;
    calibrating the wafer handling robot with the robot blade boot attached to the free end of the robot blade, wherein the calibration comprises inserting the robot blade with the robot blade boot between the two semiconductor wafers and determining whether the robot blade boot touches the two semiconductor wafers when the robot blade boot is moving between the two semiconductor wafers; and
    after the calibration, removing the robot blade boot from the free end of the robot blade.

9. The method as set forth in claim 8, wherein attaching the robot blade boot to the free end of the robot blade comprises attaching a robot blade boot having a thickness of approximately one hundred eighty thousandths of an inch (0.180") to the free end of the robot blade.

10. The method as set forth in claim 8, wherein the step of calibrating the wafer handling robot with the robot blade boot attached to the free end of the robot blade comprises the steps of:
    moving the robot blade with the robot blade boot between the two semiconductor wafers; and
    visually observing that the robot blade boot does not touch the two semiconductor wafers when the robot blade boot is moving between the two semiconductor wafers.

11. The method as set forth in claim 10, further comprising the step of:
    visually observing that the robot blade boot is centrally located between the two semiconductor wafers.

12. The method as set forth in claim 10, further comprising the steps of:
    moving the robot blade with the robot blade boot out from between the two semiconductor wafers; and
    visually observing that the robot blade boot does not touch the two semiconductor wafers when the robot blade boot is moving out from between the two semiconductor wafers.

13. The method as set forth in claim 8 further comprising the step of:
    decreasing a value of tolerance for the robot blade to move in a horizontal direction between the two semiconductor wafers in the semiconductor wafer cassette.

14. A method for calibrating a semiconductor wafer handling robot and a semiconductor wafer cassette, the method comprising the steps of:
    attaching, to a free end of a robot blade of the semiconductor wafer handling robot, a robot blade boot that is thicker than the robot blade;
    calibrating the wafer handling robot with the robot blade boot attached to the free end of the robot blade, wherein the calibration comprises inserting the robot blade with the robot blade boot into multiple slots in the semiconductor wafer cassette, wherein the robot blade boot decreases a value of tolerance for the robot blade to move between semiconductor wafers when inserted into each slot of the semiconductor wafer cassette; and after the calibration, removing the robot blade boot from the free end of the robot blade.

15. The method as set forth in claim 14, wherein attaching the robot blade boot to the free end of the robot blade comprises clamping the robot blade boot around the free end of the robot blade.

16. The method as set forth in claim 14, wherein attaching the robot blade boot to the free end of the robot blade decreases at least one of: a value of tolerance in a vertical direction and a value of tolerance in a horizontal direction for the robot blade to move between the semiconductor wafers when inserted into each slot of the semiconductor wafer cassette.

17. The method as set forth in claim 14, wherein attaching the robot blade boot to the free end of the robot blade comprises attaching a robot blade boot having a thickness of approximately one hundred eighty thousandths of an inch (0.180") to the free end of the robot blade.

18. The method as set forth in claim 17, wherein:
 a distance between semiconductor wafers in the semiconductor wafer cassette is approximately two hundred twenty thousandths of an inch (0.220"); and
 attaching the robot blade boot to the free end of the robot blade decreases the value of tolerance for the robot blade boot to move between the semiconductor wafers when inserted into each slot of the semiconductor wafer cassette to approximately twenty thousandths of an inch (0.020") on a top and a bottom of the robot blade boot.

19. The method as set forth in claim 14, further comprising the steps of:
 coloring the robot blade boot with a light color; and
 increasing a visual contrast of the robot blade boot with respect to the semiconductor wafers when the robot blade boot is positioned between the semiconductor wafers in each slot of the semiconductor wafer cassette.

20. The method as set forth in claim 14, wherein the step of calibrating the wafer handling robot comprises:
 moving the robot blade with the robot blade boot between the semiconductor wafers when inserted into each slot of the semiconductor wafer cassette; and
 visually observing that the robot blade boot does not touch the semiconductor wafers when the robot blade boot is moving between the semiconductor wafers in each slot of the semiconductor wafer cassette.

* * * * *